(12) United States Patent
Tsubata et al.

(10) Patent No.: US 7,583,354 B2
(45) Date of Patent: Sep. 1, 2009

(54) ACTIVE MATRIX SUBSTRATE, DISPLAY DEVICE, TELEVISION RECEIVER, AND METHOD FOR REPAIRING DEFECTS OF ACTIVE MATRIX SUBSTRATE

(75) Inventors: Toshihide Tsubata, Tsu (JP); Yoshihiro Okada, Minamiashigara (JP); Atsushi Ban, Nara (JP); Toshinori Sugihara, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/097,796

(22) PCT Filed: Jul. 28, 2006

(86) PCT No.: PCT/JP2006/315030

§ 371 (c)(1),
(2), (4) Date: Jun. 17, 2008

(87) PCT Pub. No.: WO2007/074556

PCT Pub. Date: Jul. 5, 2007

(65) Prior Publication Data

US 2009/0153758 A1    Jun. 18, 2009

(30) Foreign Application Priority Data

Dec. 26, 2005 (JP) ............................. 2005-373485

(51) Int. Cl.
*G02F 1/13* (2006.01)

(52) U.S. Cl. ............................. 349/192; 349/38; 349/39; 349/54; 349/55

(58) Field of Classification Search ............ 349/38–39, 349/54–55, 192

See application file for complete search history.

(56) References Cited

U.S. PATENT DOCUMENTS

| 5,054,887 | A  | 10/1991 | Kato et al.     |
| 6,661,488 | B1 | 12/2003 | Takeda et al.   |
| 6,724,452 | B1 | 4/2004  | Takeda et al.   |
| 6,822,701 | B1 | 11/2004 | Kasahara et al. |
| 7,167,224 | B1 | 1/2007  | Takeda et al.   |

(Continued)

FOREIGN PATENT DOCUMENTS

JP    2-48639 A    2/1990

(Continued)

OTHER PUBLICATIONS

Official Communication issued in International Patent Application No. PCT/JP2006/315030, mailed on Oct. 24, 2006.

(Continued)

*Primary Examiner*—David Nelms
*Assistant Examiner*—Phu Vu
(74) *Attorney, Agent, or Firm*—Keating & Bennett, LLP

(57) ABSTRACT

An active matrix substrate includes a transistor, a pixel electrode connected with one of the current-flowing electrodes of the transistor, a storage capacitor wiring, a lead wiring extending from one of the current-flowing electrodes of the transistor, and a repair wiring extending from the storage capacitor wiring. The repair wiring overlaps a portion of the lead wiring with an insulating layer interposed therebetween. As a result, TFT defects (for example, a short circuit between a source electrode and a drain electrode) can be repaired, and performance of fast display and reduction in electric power consumption can be realized.

10 Claims, 12 Drawing Sheets

U.S. PATENT DOCUMENTS

| | | |
|---|---|---|
| 7,224,421 B1 | 5/2007 | Takeda et al. |
| 7,304,703 B1 | 12/2007 | Takeda et al. |
| 7,339,633 B2 * | 3/2008 | Jeoung et al. ............... 349/38 |
| 2001/0004273 A1 | 6/2001 | Sugimoto et al. |
| 2002/0186330 A1 | 12/2002 | Kawasaki |
| 2003/0227429 A1 | 12/2003 | Shimoshikiryo |
| 2004/0119924 A1 | 6/2004 | Takeda et al. |
| 2004/0233343 A1 | 11/2004 | Baek |
| 2005/0041167 A1 | 2/2005 | Sugimoto et al. |
| 2005/0213015 A1 | 9/2005 | Shimoshikiryo |
| 2006/0256271 A1 | 11/2006 | Shimoshikiryo |
| 2007/0064187 A1 | 3/2007 | Takeda et al. |

FOREIGN PATENT DOCUMENTS

| | | | |
|---|---|---|---|
| JP | 7-13191 A | 1/1995 |
| JP | 7-199221 A | 8/1995 |
| JP | 8-234231 A | 9/1996 |
| JP | 2002-76363 A | 3/2002 |
| JP | 3491079 B2 | 1/2004 |
| JP | 2004-348130 A | 12/2004 |
| JP | 2005-173499 A | 6/2005 |
| JP | 2005-215278 A | 8/2005 |

OTHER PUBLICATIONS

Tsubata et al.: "Active Matrix Substrate, Display Device, Television Receiver, and Method for Repairing Deffects of Active Matrix Substrate," U.S. Appl. No. 12/240,179; filed Sep. 29, 2008.

* cited by examiner

F I G. 1
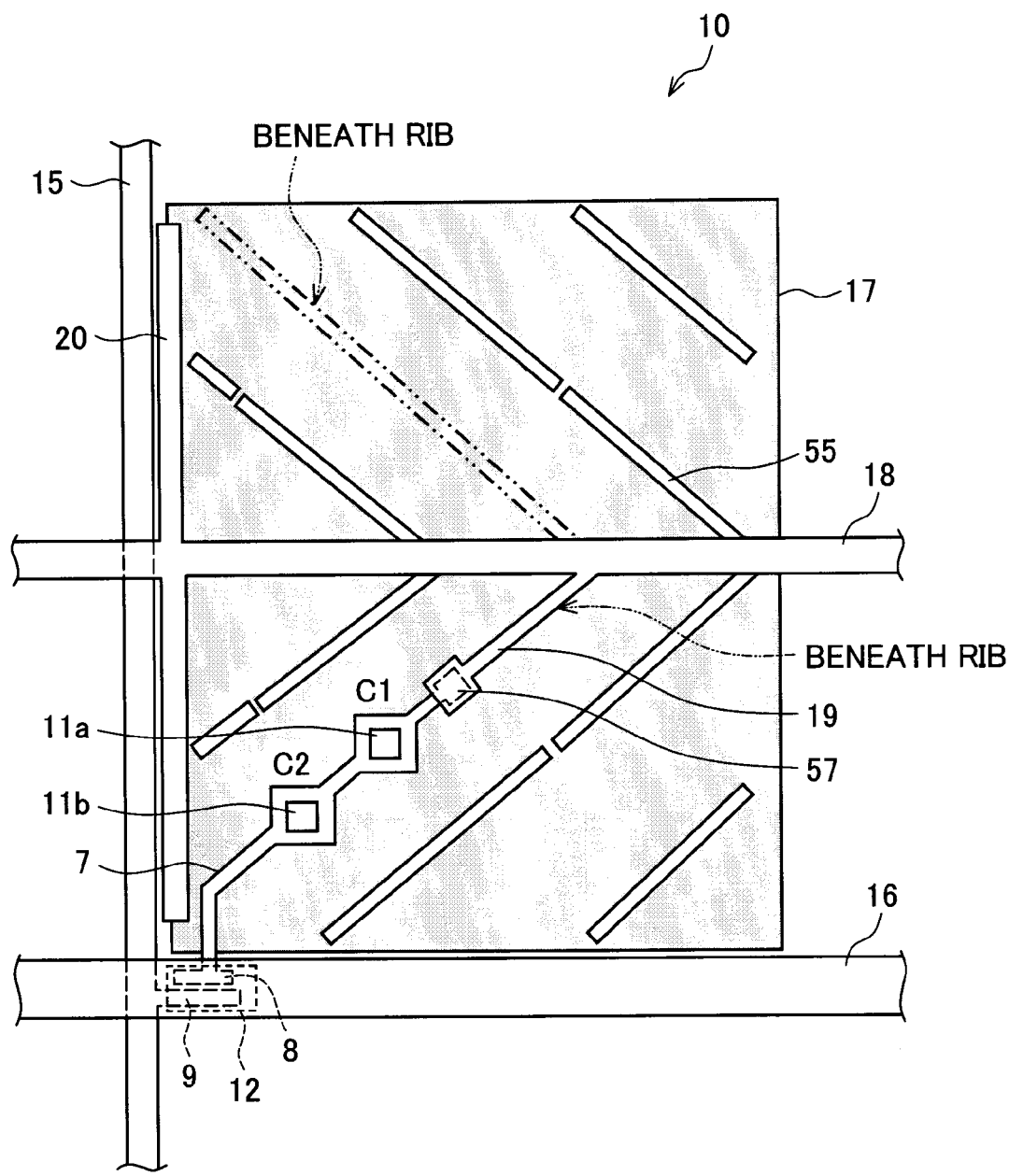

ACTIVE MATRIX SUBSTRATE, DISPLAY DEVICE, TELEVISION RECEIVER, AND METHOD FOR REPAIRING DEFECTS OF ACTIVE MATRIX SUBSTRATE

BACKGROUND OF THE INVENTION

1. Field of the Invention

The present invention relates to active matrix substrates that are used in display devices such as liquid crystal display devices.

2. Description of the Related Art

FIG. 15 indicates a conventional arrangement of an active matrix substrate used in liquid crystal display devices. As indicated in FIG. 15, an active matrix substrate 100 includes (i) a plurality of scanning signal lines 116, (ii) a plurality of data signal lines 115, arranged to cross each other, (iii) TFTs (Thin Film Transistors) 112 that are formed in the vicinity of intersection points of both signal lines (115 and 116), and (iv) pixel electrodes 117. A source electrode 119 of the TFT 112 is connected with the data signal line 115, and a drain electrode 108 is connected with the pixel electrode 117 via a drain lead electrode 107. The scanning signal line 116 also works as a gate electrode of the TFT 112.

A hole is created in an insulating film disposed between the drain lead electrode 107 and the pixel electrode 117, which hole provides a contact hole 110 that connects the drain lead electrode 107 and the pixel electrode 117. The pixel electrode 117 is a transparent electrode made of ITO or the like, which light (backlight) from beneath the active matrix substrate can pass through.

On this active matrix substrate 100, a scanning signal (gate ON voltage) sent through the scanning signal line 116 turns on the TFT 112 (that is, the TFT 112 is put in a state of allowing a current flow from the source electrode 119 to the drain electrode 108). When the TFT is ON, a data signal (signal voltage) sent through the data signal line 115 is written on the pixel electrode 117 via the source electrode 119, the drain electrode 108 and the drain lead electrode 107. A storage capacitor (Cs) wiring 118 prevents self-discharge of a liquid crystal layer while the TFT 112 is off.

In the manufacturing process of this active matrix substrate 100, foreign objects, film residues and the like may cause a short circuit or a leak between the source electrode 119 and the drain electrode 108. If such a TFT defect occurs, a normal voltage or drain voltage is not applied to the pixel electrode 117, which in turn causes a pixel defect, such as a bright dot and dark dot. This decreases the production yield of liquid crystal display devices.

As a method of dealing with such TFT defects, a redundant structure in which a plurality of TFTs are connected in parallel for one pixel has been proposed in Japanese Unexamined Patent Application Publication No. 7-199221, for example.

The liquid crystal display device set forth in Japanese Unexamined Patent Application Publication No. 7-199221 provides redundancy by arranging a plurality of TFTs (active elements) in parallel. Such a redundant structure increases parasitic capacitance between the TFTs and the scanning signal lines, and leads to lessened display quality (particularly in displaying moving images) as signal write frequencies have become higher in recent years. In addition, the electric power consumption increases as capacity loads grow larger, and the aperture ratio decreases because a plurality of TFTs are arranged in parallel.

SUMMARY OF THE INVENTION

In order to overcome the problems described above, preferred embodiments of the present invention provide an active matrix substrate that can repair TFT defects (for example, a short circuit between a source electrode and a drain electrode), perform fast display, and reduce electric power consumption.

More specifically, the active matrix substrate according to a preferred embodiment of the present invention, includes: a transistor; a pixel electrode connected with one of the current-flowing electrodes of the transistor; a storage capacitor wiring; a lead electrode extending from the one of the current-flowing electrodes of the transistor; and a repair wiring extending from the storage capacitor wiring and arranged to overlap a portion of the lead wiring with an insulating layer interposed therebetween.

According to this arrangement, if a transistor malfunctions, while separating the pixel electrode of the defective pixel from the transistor, the pixel electrode can be connected with the storage capacitor wiring via the repair wiring and the lead wiring described above, by connecting the repair wiring and the lead wiring through penetration of the insulating layer, and cutting the lead wiring between (a) a point (for example, a contact hole) in which the lead wiring intersects with the pixel electrode, and (b) the one current-flowing electrode. This can lower the electric potential of the pixel electrode of the defective pixel to the electric potential of the storage capacitor. Therefore, for example, when this active matrix substrate is used in a normally black liquid crystal display device, a malfunctioning pixel (a defective pixel) becomes a dark dot so as not to be very visible.

Furthermore, according to the aforementioned arrangement, the repair wiring extends from the storage capacitor wiring, which can significantly reduce increase in capacity loads compared to the conventional arrangement, in which active elements are arranged in parallel. As a result, it is possible to perform fast drive and prevent unnecessary increases in electric power consumption.

According to a preferred embodiment of the present invention, such an arrangement is possible that the aforementioned transistor is a field-effect transistor (including a TFT) and that the lead wiring is connected with the drain electrode (the one current-flowing electrode) of the field-effect transistor.

According to a preferred embodiment of the present invention, it is preferable that the lead wiring should be connected with the pixel electrode through a contact hole that is formed between one of the current-flowing electrodes and a portion of the lead wiring at which the repair wiring overlaps the lead wiring. One exemplary arrangement is such that an end of the repair wiring and an end of the lead wiring overlap.

As a result, the lead wiring, which blocks light, can be shortened compared to such arrangements that a contact hole is created elsewhere. Accordingly, the aperture ratio of this active matrix substrate can be increased. In this case, it is preferable that a notch section (or a through bore section) should be formed on the pixel electrode, and that at least a portion of the notch section should overlap a portion of the lead wiring between the one current-flowing electrode and the contact hole. As a result, if a transistor malfunctions, the lead wiring can be cut in such a portion (a portion without a pixel electrode above), which in turn facilitates the cutting process. In addition, this notch section is preferably formed on an edge of the pixel electrode. This can reduce to the full the influence that the notch section gives to the display. And it is preferable that, when the active matrix substrate is combined with a counter substrate, at least a portion of the notch section should overlap a black matrix of the counter substrate. This allows the black matrix to prevent light leaks through the notch section.

According to a preferred embodiment of the present invention, such an arrangement is possible that the lead wiring has in the contact hole a through a bore section in which no electrode is formed. This makes it possible to form an optically transparent portion in the contact hole, which is normally light-blocking. As a result, the aperture ratio of this active matrix substrate can be increased. In this case, the aperture of the contact hole is preferably in a stretched shape and crosses the through bore section. As a result, the active matrix substrate can be more tolerant of misalignment during the manufacturing process, and such a contact hole can be realized that has an optically transparent portion, while securing a sufficient contact area for the lead wiring and the pixel electrode.

According to a preferred embodiment of the present invention, it is preferable that the storage capacitor wiring stretches alongside the data signal line connected with the other current-flowing electrode of the transistor, and that the stretched portion of the storage capacitor wiring overlaps an edge of the pixel electrode. As a result, this stretched portion can shield or decrease an electric field between the pixel electrode and the data signal line. Accordingly, when this active matrix substrate is applied to a display device, it is possible to improve display quality.

According to a preferred embodiment of the present invention, it is preferable that a slit for alignment control of liquid crystal molecules in which slit no electrode is formed should be created on the pixel electrode, and (when looking in the direction of the normal line of the substrate surface) at least a portion of the repair wiring preferably overlaps the slit for alignment control of liquid crystal molecules.

With the slit for alignment control of liquid crystal molecules created on the pixel electrode as described above, when this active matrix substrate is applied to a liquid crystal display device, a broadened viewing angle can be realized.

Furthermore, by forming the repair wiring beneath the slit of the pixel electrode, the fringe field effect can be enhanced. And, because the slit of the pixel electrode does not function as an optically transparent area (an aperture), by forming the repair wiring so as to overlap the slit, decreases in the aperture ratio caused by the stretching (extracting) of the storage capacitor wiring can be prevented.

This active matrix substrate may be combined with a counter substrate that has a projection for alignment control of liquid crystal molecules, and it is preferable that the repair wiring be formed so that at least a portion thereof overlaps the projection for alignment control of liquid crystal molecules.

With the projection for alignment control of liquid crystal molecules created on the counter substrate (counter electrode) as described above, when this active matrix substrate is applied to a liquid crystal display device, a broadened viewing angle can be realized. And, because the projection for alignment control of liquid crystal molecules does not function as an optically transparent area (an aperture), by forming the repair wiring to overlap this projection for alignment control of liquid crystal molecules, decrease in the aperture ratio caused by the stretching (extracting) of the storage capacitor wiring can be prevented.

According to a preferred embodiment of the present invention, it is preferable that the slit for alignment control of liquid crystal molecules in which slit no electrode is formed should be created on the pixel electrode, and that at least a portion of the lead wiring overlaps the slit for alignment control of liquid crystal molecules.

With the slit for alignment control of liquid crystal molecules formed on the pixel electrode as described above, when this active matrix substrate is applied to a liquid crystal display device, a broadened viewing angle can be realized.

And, because the slit on the pixel electrode does not function as an optically transparent area (an aperture), by forming the lead wiring to overlap this slit, decreases in the aperture ratio caused by the lead wiring can be prevented. In this case, it is preferable that the lead wiring be formed to overlap the slit for alignment control of liquid crystal molecules between the one current-flowing electrode and the contact hole. As a result, if a transistor malfunctions, the lead wiring can be cut conveniently in a portion thereof which overlaps with the slit for alignment control of liquid crystal molecules (that is, a portion without a pixel electrode above). Therefore, the cutting process becomes easier.

This active matrix substrate may be combined with a counter substrate that has the projection for alignment control of liquid crystal molecules, and it is preferable that the lead wiring be formed so that at least a portion thereof overlaps the projection for alignment control of liquid crystal molecules.

With the projection for alignment control of liquid crystal molecules created on the counter substrate (counter electrode) as described above, when this active matrix substrate is applied to a liquid crystal display device, a broadened viewing angle can be realized. And, because the projection for alignment control of liquid crystal molecules does not function as an optically transparent area (an aperture), by forming the lead wiring to overlap this projection for alignment control of liquid crystal molecules, decreases in the aperture ratio caused by the lead wiring can be prevented.

This active matrix substrate includes: a transistor; a pixel electrode connected with one of the current-flowing electrodes of the transistor; and a storage capacitor wiring. By stretching the storage capacitor wiring and creating an overlapping area in which a stretched portion of this storage capacitor wiring and the lead wiring overlap each other with an insulating layer interposed therebetween, the stretched portion and the lead wiring can be connected through penetration of the insulating layer.

Such an arrangement is also possible that this active matrix substrate includes in each pixel area (i) first and second transistors, (ii) a first pixel electrode connected with one of current-flowing electrodes of the first transistor, (iii) a second pixel electrode connected with one of current-flowing electrodes of the second transistor, (iv) first and second storage capacitor wirings, (v) a first lead wiring extending from one of current-flowing electrodes of the first transistor, (vi) a first repair wiring extending from the first storage capacitor wiring, (vii) a second lead wiring extending from one of current-flowing electrodes of the second transistor, and (viii) a second repair wiring extending from the second storage capacitor wiring, the first repair wiring overlapping a portion of the first lead wiring with an insulating layer interposed therebetween, the second repair wiring overlapping with a portion of the second lead wiring with an insulating layer interposed therebetween.

In the aforementioned arrangement, one pixel is divided into two or more sub-pixels, and each sub-pixel is driven individually (using the so-called multi-pixel drive). In this arrangement, because display is performed by the total luminance of all the sub-pixels, even if one sub-pixel is repaired and becomes a dark dot, the overall pixel does not become a dark dot. Therefore, defective pixels can be made less visible.

A display device according to another preferred embodiment of the present invention includes one of the active matrix substrates described above.

A television receiver according to a further preferred embodiment of the present invention includes the aforementioned display device and a tuner unit that receives television broadcast.

A method for repairing defects of an active matrix substrate according to a preferred embodiment of the present invention repairs defects of the active matrix substrate which includes a transistor, a pixel electrode connected with one of the current-flowing electrodes of the transistor, and a storage capacitor wiring. Further, (i) a lead wiring connected with one of current-flowing electrodes of the transistor, and (ii) the storage capacitor wiring or a repair wiring connected with the storage capacitor wiring which overlaps a portion of the lead wiring with an insulating layer interposed therebetween are formed. By connecting the lead wiring with the pixel electrode through a contact hole, if the transistor malfunctions, the lead wiring and the storage capacitor wiring are connected through penetration of the insulating layer, and this lead wiring is cut between the one current-flowing electrode and the contact hole.

According to the aforementioned method, if the transistor malfunctions, by connecting the pixel electrode and the repair wiring via the lead wiring, the electric potential of the pixel electrode of the defective pixel can be lowered to the potential of the storage capacitor wiring. Therefore, when the method is used in a normally black liquid crystal display device, a malfunctioning pixel (a defective pixel) becomes a dark dot so as to become less visible. In the aforementioned method, it is preferable that the cutting be performed in a portion thereof which overlaps with an edge of the pixel electrode. It is also preferable that, on the pixel electrode, a notch section that overlaps the portion to be cut should be formed.

In the aforementioned method, it is preferable that, when the slit for alignment control of liquid crystal molecules in which slit no electrode is formed is created, the lead wiring be formed so that the portion to be cut overlaps the slit for alignment control of liquid crystal molecules. This makes the cutting process easier.

As described above, if the transistor malfunctions, this active matrix substrate can connect the pixel electrode and the storage capacitor wiring via the repair wiring and the lead wiring. Therefore, when the active matrix substrate is used in a normally black liquid crystal display device, a malfunctioning pixel (a defective pixel) becomes a dark dot so as to become less visible, which can improve the yield. Furthermore, in the aforementioned arrangement, increases in capacity loads can be reduced significantly compared to the conventional arrangement of arranging active elements in parallel. As a result, it is possible to perform fast drive and prevent unnecessary increases in electric power consumption.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 1 is a plan view of an arrangement of an active matrix substrate according to a preferred embodiment of the present invention.

DETAILED DESCRIPTION OF PREFERRED EMBODIMENTS

Figure 2:
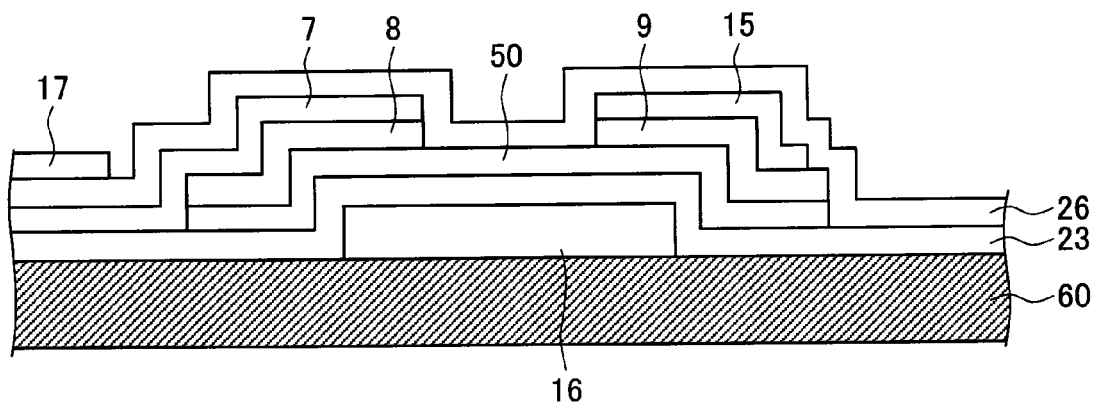
FIG. 2 is a sectional view of a structure of the active matrix substrate.

Preferred embodiments of the present invention are described below with reference to the attached drawings.

FIG. 1 is a perspective plan view of an arrangement of an active matrix substrate of the present preferred embodiment (viewed from an underside of the substrate).

As FIG. 1 indicates, an active matrix substrate 10 includes (i) a plurality of scanning signal lines 16 extended horizontally in FIG. 1, (ii) a plurality of data signal lines 15 extended vertically in FIG. 1, the data signal lines 15 crossing the scanning signal lines 16 substantially at right angles, (iii) TFTs (Thin Film Transistors) 12 formed in the vicinity of intersection points of both signal lines (15 and 16), (iv) and pixel electrodes 17. A source electrode 9 of the TFT 12 is connected with the data signal line 15, and a drain electrode 8 is connected with the pixel electrode 17 via a drain lead wiring 7 (a lead wiring). The scanning signal line 16 also works as a gate electrode of the TFT 12. This TFT on-gate structure can improve the aperture ratio. The pixel electrode 17 is a transparent electrode made of ITO or the like, which light (backlight) from beneath the active matrix substrate 10 can pass through.

On this active matrix substrate 10, a scanning signal (gate ON voltage) sent through the scanning signal line 16 turns on the TFT 12 (that is, the TFT 12 is put in a state of allowing a current flow from the source electrode 9 to the drain electrode 8). When the TFT 12 is on, a data signal (signal voltage) sent through the data signal line 15 is written on the pixel electrode 17 via the source electrode 9, the drain electrode 8 and the drain lead wiring 7. Described below in detail is each portion of this active matrix substrate 10.

The pixel electrode 17 has a slit for controlling the orientation of liquid crystal molecules (a slit for alignment control of liquid crystal molecules) 55, which is V-shaped and turned around 90 degrees. This arrangement is used in the MVA (Multi-domain Vertical Alignment), which is preferably used particularly in large-size liquid crystal display televisions, in order to broaden viewing angles (See, for example, Japanese Unexamined Patent Application Publication No. 2001-83523). This MVA utilizes a fringe field formed by creating a slit (a pattern of electrode cutoff) on a pixel electrode of an active matrix substrate, and also creating a projection (rib) for alignment control of liquid crystal molecules on the counter electrode of a counter substrate. This fringe field can cause dispersed orientation directions of liquid crystal molecules, whereby a broadened viewing angle can be realized. The planar shape of the slit 55 (when viewing the substrate surface vertically), as FIG. 1 indicates, may be strip-shaped and regularly zigzagged.

A storage capacitor (Cs) wiring 18 is, as in FIG. 1, formed at a right angle with the data signal line 15 (i.e., in parallel with the scanning signal line 16) across the pixel electrode 17. A repair wiring 19, and a stretched portion 20 of the storage capacitor wiring are drawn from the storage capacitor wiring 18.

The repair wiring 19 is drawn diagonally from a central portion of the storage capacitor wiring 18 (i.e., an area below the center of the pixel electrode 17), and an end of the repair wiring 19 defines an overlapping area 57. In this overlapping area 57, an end of the drain lead wiring 7 and the end of the repair wiring 19 overlap. The stretched portion 20 of the storage capacitor wiring is formed alongside the data signal line 15, and covers an edge of the pixel electrode 17 (a portion of the stretched portion 20 of the storage capacitor wiring overlaps the pixel electrode 17, and no other portion does).

The storage capacitor wiring 18, the pixel electrode 17, and an (interlayer) insulating film disposed therebetween form a storage capacitor, and the stretched portion 20 of the storage capacitor wiring, the pixel electrode 17, and an (interlayer) insulating film disposed therebetween form a storage capacitor. Also, the repair wiring 19, the pixel electrode 17, and an (interlayer) insulating film disposed therebetween form a storage capacitor as well. These storage capacitors function as supplementary capacitors that retain the potential written on the pixel electrode 17 until a subsequent data signal is written into the pixel electrode 17.

Furthermore, on this active matrix substrate 10, the repair wiring 19 is used to repair TFT defects (described below in detail), and the stretched portion 20 of the storage capacitor wiring is used to shield or decrease an electric field between the data signal line 15 and the pixel electrode 17.

Additionally, the repair wiring 19 is extended diagonally from the storage capacitor wiring 18 so as to overlap a projection (rib) for alignment control of liquid crystal molecules, the projection being created on a counter substrate (a counter electrode) of the active matrix substrate 10. By forming the repair wiring 19, which blocks light, under the projection (rib) for alignment control of liquid crystal molecules, which projection also blocks light, decreases in the aperture ratio by the repair wiring 19 can be prevented. Light leaks can also be prevented.

The drain lead wiring 7 has contact areas C1 and C2 between the overlapping area 57 (one end of the drain lead wiring) and the drain electrode 8 (the other end of the drain lead wiring). A contact hole 11a is formed in this contact area C1, and the drain lead wiring 7 and the pixel electrode 17 are connected in this contact hole 11a. A contact hole 11b is formed in the contact area C2, and the drain lead wiring 7 and the pixel electrode 17 are also connected in this contact hole 11b. The drain lead wiring 7 is formed to overlap the projection (rib) for alignment control of liquid crystal molecules on the counter substrate (counter electrode). By forming the drain lead wiring 7, which blocks light, under the rib, which also blocks light, decreases in the aperture ratio by the drain lead wiring 7 can be prevented. Light leaks can also be prevented.

FIG. 2 is a sectional view of the TFT 12 indicated in FIG. 1. As illustrated in FIG. 2, the scanning signal line 16, which also works as a gate electrode, is formed on a glass substrate 60, and a gate insulating film 23 is formed on this gate electrode. On this gate insulating film 23, a semiconductor layer (i-layer) 50 is formed, and the drain electrode 8 and the source electrode 9 are formed on this semiconductor layer 50. The drain lead wiring 7 is formed on this drain electrode 8, and the data signal line 15 is formed on the source electrode 9. And on the drain lead wiring 7, between the drain electrode 8 and the source electrode 9, and on the data signal line 15, a passivation film 26 is formed.

Figure 3:
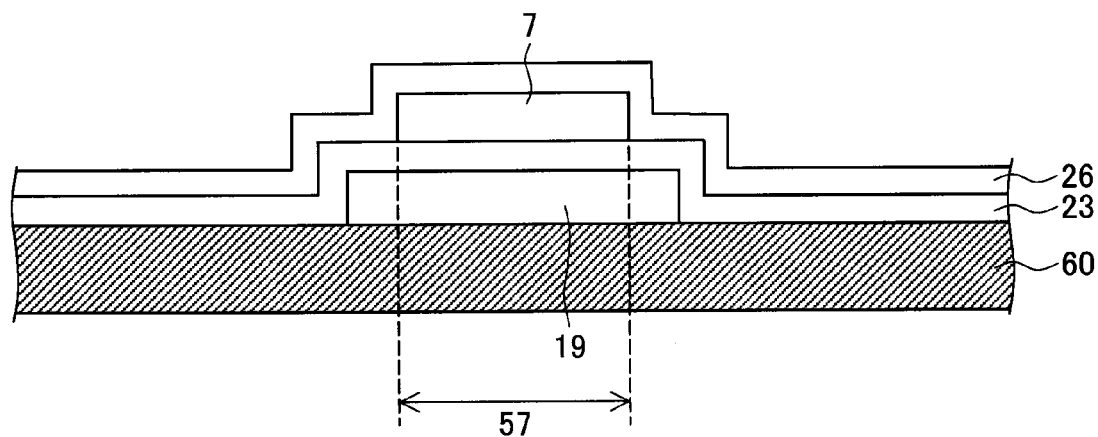
FIG. 3 is a sectional view of a structure of the active matrix substrate.

FIG. 3 is a sectional view of the active matrix substrate 10 including the overlapping area (57) indicated in FIG. 1. As illustrated in FIG. 3, the repair wiring 19 is formed on a glass substrate 60, and the drain lead wiring 7 is formed on this repair wiring 19 with a gate insulating film 23 interposed therebetween. An area in which the repair wiring 19 and the drain lead wiring 7 overlap each other with the gate insulating film 23 interposed therebetween is the overlapping area 57. In the present preferred embodiment, the overlapping area 57 preferably is approximately 200 $\mu m^2$, for example, and, if a malfunction such as a short circuit occurs to the TFT 12, electric current can flow between the repair wiring 19 and the drain lead wiring 7 through penetration of the insulating layer (gate insulating film) 23.

By forming the overlapping area 57 preferably to be approximately 200 $\mu m^2$, in the melting process of the insulating film by yttrium aluminum garnet (YAG) lasers or the like, a sufficient laser-irradiation area is secured, which can in turn increase the reliability of current flows between the repair wiring 19 and the drain lead wiring 7. When considering (i) changes in the overlapping area caused by misalignment in the photolithography process, (ii) broadening of irradiation beam radius of a YAG laser-irradiation area during laser irradiation; and (iii) the film configuration that will be tapered at the melted area of the repair wiring 19 and the drain lead wiring 7 after the laser irradiation, it is preferable that the overlapping area should be large to some extent. More specifically, it is more preferably about 400 $\mu m^2$ or wider.

The passivation film 26 is formed on the drain lead wiring 7. In the case of FIG. 1, because the overlapping area 57 does not overlap the slit 55, a pixel electrode (ITO) is formed on the passivation film 26 (this configuration is not illustrated in FIG. 1).

Explained below is a method for repairing TFT defects (pixel defects) in accordance with the present preferred embodiment.

Figure 4:
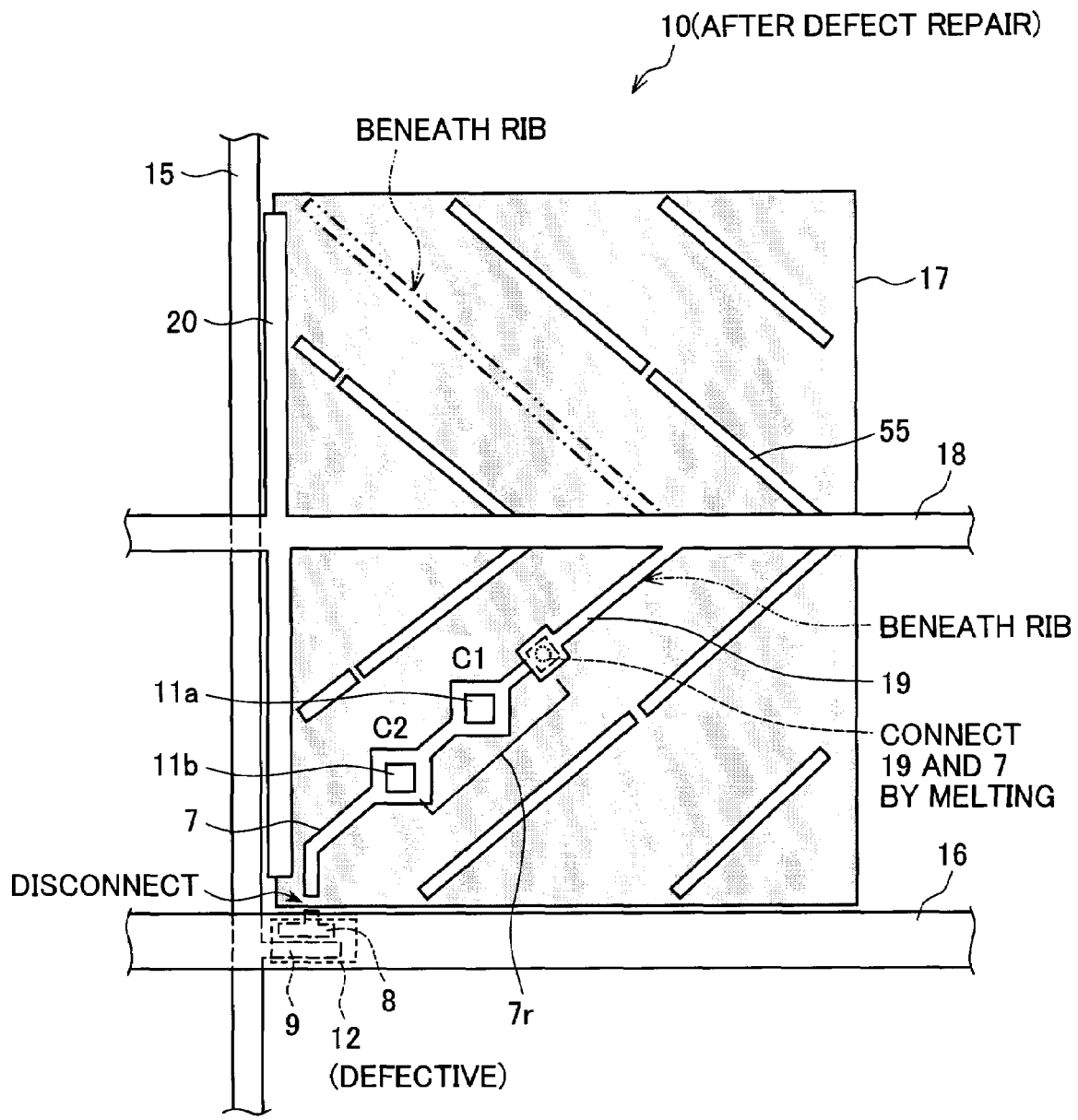
FIG. 4 is a plan view of an arrangement of the active matrix substrate after a defect repair according to a preferred embodiment of the present invention.

FIG. 4 illustrates the active matrix substrate after repairing a defect that occurred to the TFT 12. As FIG. 4 illustrates, if a defect is detected on the TFT 12, the drain lead wiring 7 is cut in a portion thereof between the drain electrode 8 and the contact hole 11b, and the gate insulating film 23 (see FIG. 3) is penetrated in the overlapping area 57 so that electric current can flow between the repair wiring 19 and the drain lead wiring 7. As a result, the repair wiring 19 and the pixel electrode 17 are electrically connected via a portion 7r of the drain lead wiring 7 and the contact holes 11a and 11b. This can keep the potential of the pixel electrode 17 equal to that of the storage capacitor wiring 18 all the time, which brings about a dark dot (less visible compared to a bright dot) in a normally black liquid crystal display device. The portion to be cut may be anywhere between the drain electrode 8 and the contact hole 11*b* (or the contact hole 11*a*). Also, it is possible to facilitate cutting a portion, for example, by predetermining a portion to be cut and making it thinner beforehand.

Figure 7:
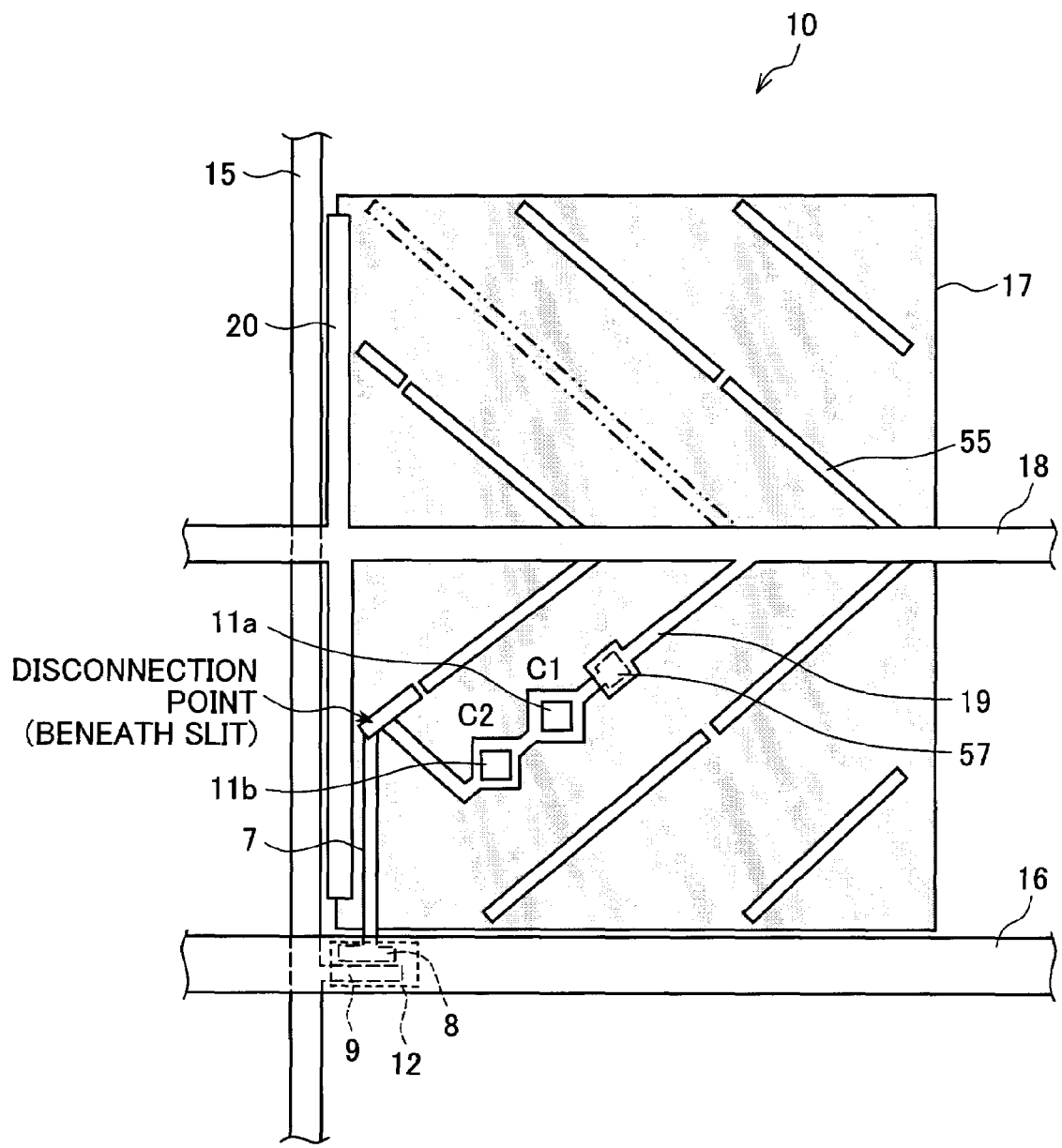
FIG. 7 is a plan view of an arrangement of the active matrix substrate.
Figure 9:
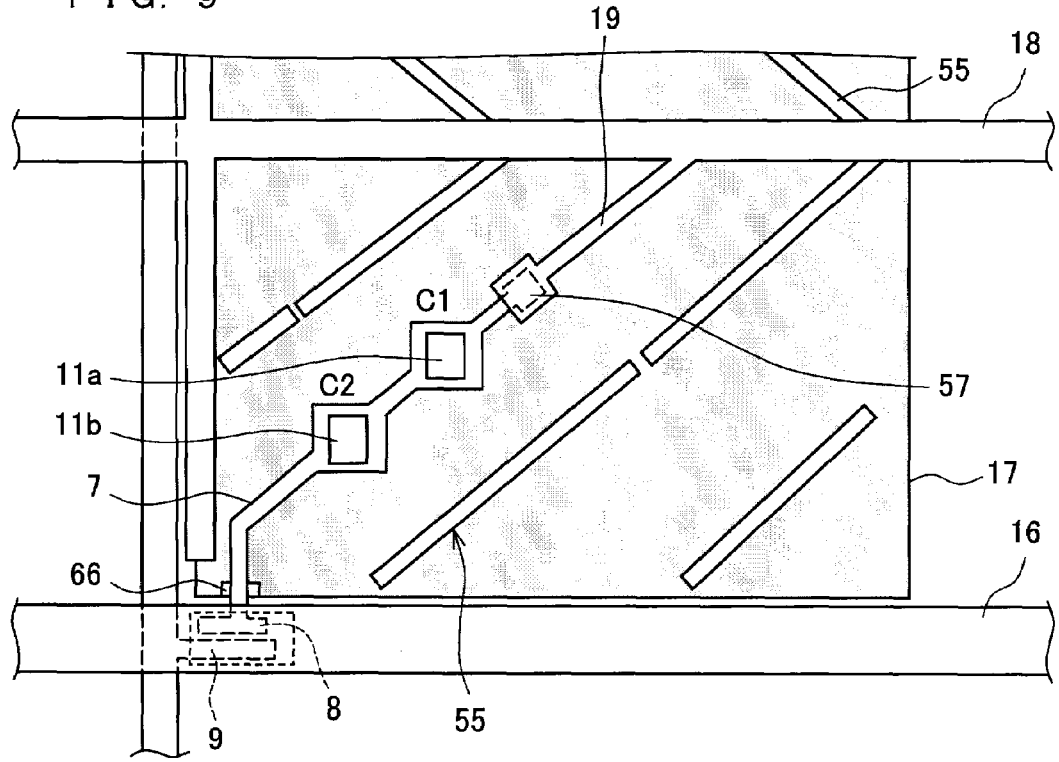
FIG. 9 is a plan view of an arrangement of the active matrix substrate.

In cutting the drain lead wiring 7, the cutting process is easier if there is not ITO (the pixel electrode 17) above the drain lead wiring 7. As FIG. 7 indicates, it is possible to stretch a portion of the drain lead wiring 7 between the drain electrode 8 and the contact hole 11*a* (11*b*) so that the portion of the drain lead wiring 7 runs beneath the slit 55 in order that cutting may be performed beneath the slit 55. Also, as FIG. 9 illustrates, it is possible to form a notch section (or through bore section) 66 on an edge of the pixel electrode 17 so that the drain lead wiring 7 will be cut beneath the notch section 66. With the edge of the pixel electrode 17 overlapping a black matrix (see FIG. 10) on a counter substrate, light leaks through the notch section 66 can be prevented. Because the black matrix can also perform the function of blocking light for a TFT, decreases in the aperture ratio can be prevented.

The drain lead wiring 7 is cut by, for example, laser irradiation at the portion to be cut from either an upside or an underside of the active matrix substrate 10 (fracture splitting). A possible laser wavelength is, for example, the fourth harmonic generation (a wavelength of about 266 nm, for example). The drain lead wiring 7 and the repair wiring 19 are electrically connected (melt of the overlapping area 57) by laser irradiation at the conduction point (the overlapping area 57) from either the upside or the underside of the active matrix substrate 10. A possible laser wavelength is, for example, the second harmonic generation (a wavelength of about 532 nm, for example).

A defect of the active matrix substrate can be identified by such methods as visual inspection and electronic inspection. One example of this electronic inspection is a method that applies electro-optic effect, in which, when crystals are arranged in an electric field, light transmission fluctuates depending on the electric intensity. More specifically, on one side of a modulator, whose transmission fluctuates linearly depending on the electronic intensity, a transparent electrode is formed, and, on the other side, a reflection surface is formed to reflect light. The modulator is arranged so that the reflection surface faces the active matrix substrate 10, and light irradiated from the electrode side of the modulator transmits through the modulator and is reflected on the reflection surface. This reflected light is received by a CCD (Charged Coupled Devices) camera. Defective portions of an active matrix substrate are identified based on the intensity of this reflected light. An example of visual inspection is pattern recognition that compares patterns of neighboring picture elements, in which a difference, if any, is judged as indicative of the active matrix substrate having a defective portion.

A defect of the active matrix substrate can be repaired, at the latest, after forming a pixel electrode; alternatively, after forming the drain lead wiring 7, or after channel etching. However, in order to electronically cut a leaking channel without fail and form an alternative channel, it is preferable to repair the defect after forming a liquid crystal layer (after forming a liquid crystal panel by attaching the active matrix substrate to a color filter substrate, injecting liquid crystals, and sealing the liquid crystal panel) so that the panel can be lit for confirmation.

Explained below is an exemplary method of manufacturing this active matrix substrate. In accordance with the present preferred embodiment, a gate electrode connected with the scanning signal line 16 is created on the transparent insulating substrate 60 made of glass, plastic or the like. In the present preferred embodiment, the scanning signal line 16 also works as a gate electrode of the TFT 12 because the TFT 12 is created on the scanning signal line 16. The scanning signal line 16 (the gate electrode) is preferably formed from: a film of metal such as titanium, chromium, aluminum, molybdenum, tantalum, tungsten or copper; an alloy film of these; or a laminated film of these. The scanning signal line 16 preferably has a thickness of about 1000 Å to about 3000 Å. The scanning signal line 16 is formed by such techniques as sputtering, and patterned into a required shape by such techniques as photo etching.

The storage capacitor wiring 18, the repair wiring 19, and the stretched portion 20 of the storage capacitor wiring are formed by the same process as the scanning signal line 16 (the gate electrode). By forming them by the same process, it is possible to shorten the manufacturing process and reduce manufacturing costs. The repair wiring 19 and the stretched portion 20 of the storage capacitor wiring are formed to overlap the drain lead wiring 7, which is formed in an upper layer in a later process.

Also, in accordance with the present preferred embodiment, the gate insulating film 23 is formed so as to cover the scanning signal line 16 (the gate electrode), the storage capacitor wiring 18, the repair wiring 19 and the stretched portion 20 of the storage capacitor wiring. The gate insulating film 23 is formed from an insulating film made of silicon nitride, silicon oxide or the like. The high-resistance semiconductor layer 50 made of amorphous silicon, polysilicon or the like is created above the gate insulating film 23. Furthermore, a low-resistance semiconductor layer as an ohmic contact layer made of $n^+$ amorphous silicon or the like is created, which layer is doped by such impurities as phosphorus. This forms the source electrode 9 and the drain electrode 8. The gate insulating film 23 made of silicon nitride, silicon oxide or the like, the high-resistance semiconductor layer 50 made of amorphous silicon or the like, and the low-resistance semiconductor layer made of $n^+$ amorphous silicon or the like (8 and 9) are all formed by such techniques as the plasma CVD (chemical vapor deposition), and patterned by such techniques as photo etching.

In accordance with the present preferred embodiment, for example, the thickness of the silicon nitride film as the gate insulating film 23 preferably is about 3000 Å to about 5000 Å, the thickness of the amorphous silicon film as the high-resistance semiconductor layer 50 preferably is about 1000 Å to about 3000 Å, and the thickness of the $n^+$ amorphous silicon film as the low-resistance semiconductor layer (8 and 9) preferably is about 400 Å to about 700 Å, for example.

The data signal line 15 and the drain lead wiring 7 are preferably formed by the same process. The data signal line 15 and the drain lead wiring 7 are formed from: a film of such metal as titanium, chromium, aluminum, molybdenum, tantalum, tungsten or copper; an alloy film of these; or a laminated film of these. The data signal line 15 preferably has a thickness of about 1000 Å to about 3000 Å, for example. The data signal line 15 is formed by such techniques as sputtering, and patterned into a required shape by such techniques as photo etching. The TFT 12 is formed by: masking the patterns of the data signal line 15 and the drain lead wiring 7 against the high-resistance semiconductor layer 50 made of amorphous silicon or the like, and the low-resistance semiconductor layers 8 and 9 made of $n^+$ amorphous silicon or the like; and dry-etching channels.

In accordance with the present preferred embodiment, an inorganic insulating film made of silicon nitride, silicon oxide or the like is created as the passivation film 26 (an interlayer insulating film). For example, a silicon nitride film with a thickness of about 2000 Å to about 5000 Å, for example, formed by such techniques as the plasma CVD can be utilized.

In accordance with the present preferred embodiment, the contact holes 11 (11a and 11b) are formed by penetrating the passivation film 26, which is formed to cover an upper side of the TFT 12, the scanning signal line 16, the data signal line 15 and the drain lead wiring 7. The contact holes 11 are formed by patterning the passivation film 26 into a required shape by such techniques as photo etching.

In accordance with the present preferred embodiment, the pixel electrode 17 is formed above the passivation film 26 with such a transparent conductive film as ITO, IZO, zinc oxide or tin oxide. The pixel electrode 17 preferably has a thickness of about 1000 Å to about 2000 Å. The pixel electrode 17 is formed by such techniques as sputtering, and patterned into a required shape by such techniques as photo etching.

Figure 10:
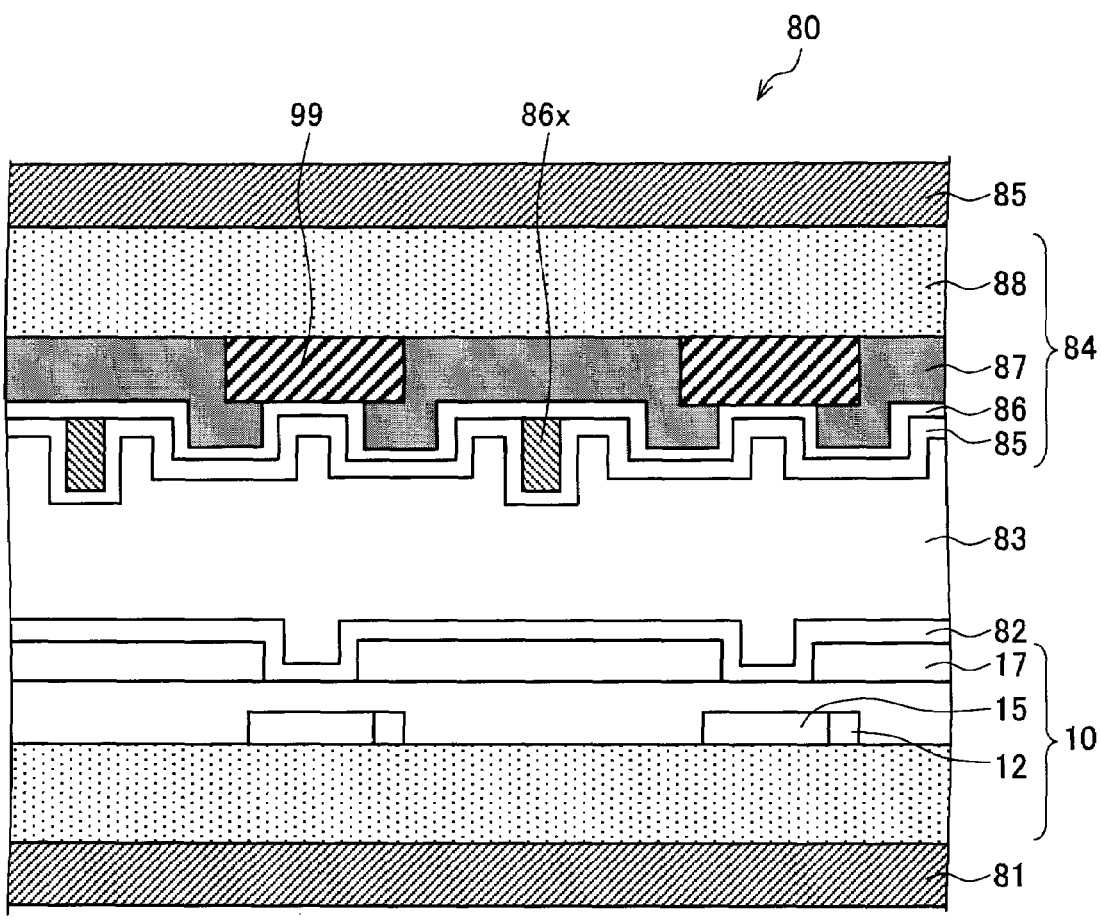
FIG. 10 is a sectional view of a liquid crystal panel that includes the active matrix substrate.

FIG. 10 illustrates an arrangement of a liquid crystal panel in which the active matrix substrate 10 is incorporated. As FIG. 10 illustrates, a liquid crystal panel 80 equipped with the active matrix substrate 10 includes, in the order from a backlight source: a polarizer 81; the active matrix substrate 10; an alignment film 82; a liquid crystal layer 83; a color filter substrate 84; and a polarizer 85. The color filter substrate 84 includes, in the order from the liquid crystal layer 83: a polarizer 85; a common (counter) electrode 86; a colored layer 87 (including a black matrix 99); and a glass substrate 88. And a projection for alignment control of liquid crystal molecules (rib) 86x is created on this common (counter) electrode 86. The projection for alignment control of liquid crystal molecules 86x is formed, for example, from photosensitive resin or the like. The planar shape of the rib 86x (when viewing the substrate surface vertically) may be regularly zigzagged and strip-shaped (e.g., substantially V-shaped and turned around 90 degrees).

Explained now is a method of injecting liquid crystals between an active matrix substrate and a color filter substrate when forming a liquid crystal panel. The vacuum injection method may be used as a method of injecting liquid crystal, in which an opening for injecting the liquid crystal is created on the periphery of the substrate, and the liquid crystal is injected by immersing, under vacuum, the opening in the liquid crystal and, exposing it to the atmosphere, and then the opening is sealed with UV cured resin or the like. However, in the case of a vertically aligned liquid crystal panel, because the injection time becomes very long compared to a horizontally aligned panel, it is preferable to use the liquid crystal falling-drip/ attaching method, which is explained below. First, UV cured seal resin is applied to the periphery of the active matrix substrate, and the liquid crystal is dripped onto the color filter substrate by the falling-drip method. The most appropriate amount of liquid crystals is dripped evenly into the area surrounded by the seal by the liquid crystal falling-drip method so that the intended cell gap is formed by the liquid crystal. Then, in order to attach the color filter to the active matrix substrate, to which the seal has been applied and the liquid crystals have been dripped as described above, the atmosphere inside an attachment device is decompressed to about 1 Pa, and attachment of the substrates is performed at this decompressed pressure. After that, the atmosphere is returned to the atmospheric pressure so that the seal portion is crushed and the intended cell gap is obtained. Subsequently, after the seal resin is tentatively cured by UV irradiation, the seal resin is baked to finalize the curing. At this stage, the liquid crystal is spread in the area surrounded by the seal, and the cell is filled with the liquid crystal. Finally, after completing the baking, it is divided into panels, and polarizers are attached to them. Through the aforementioned process, a liquid crystal panel as indicated in FIG. 10 is created.

Figure 5:
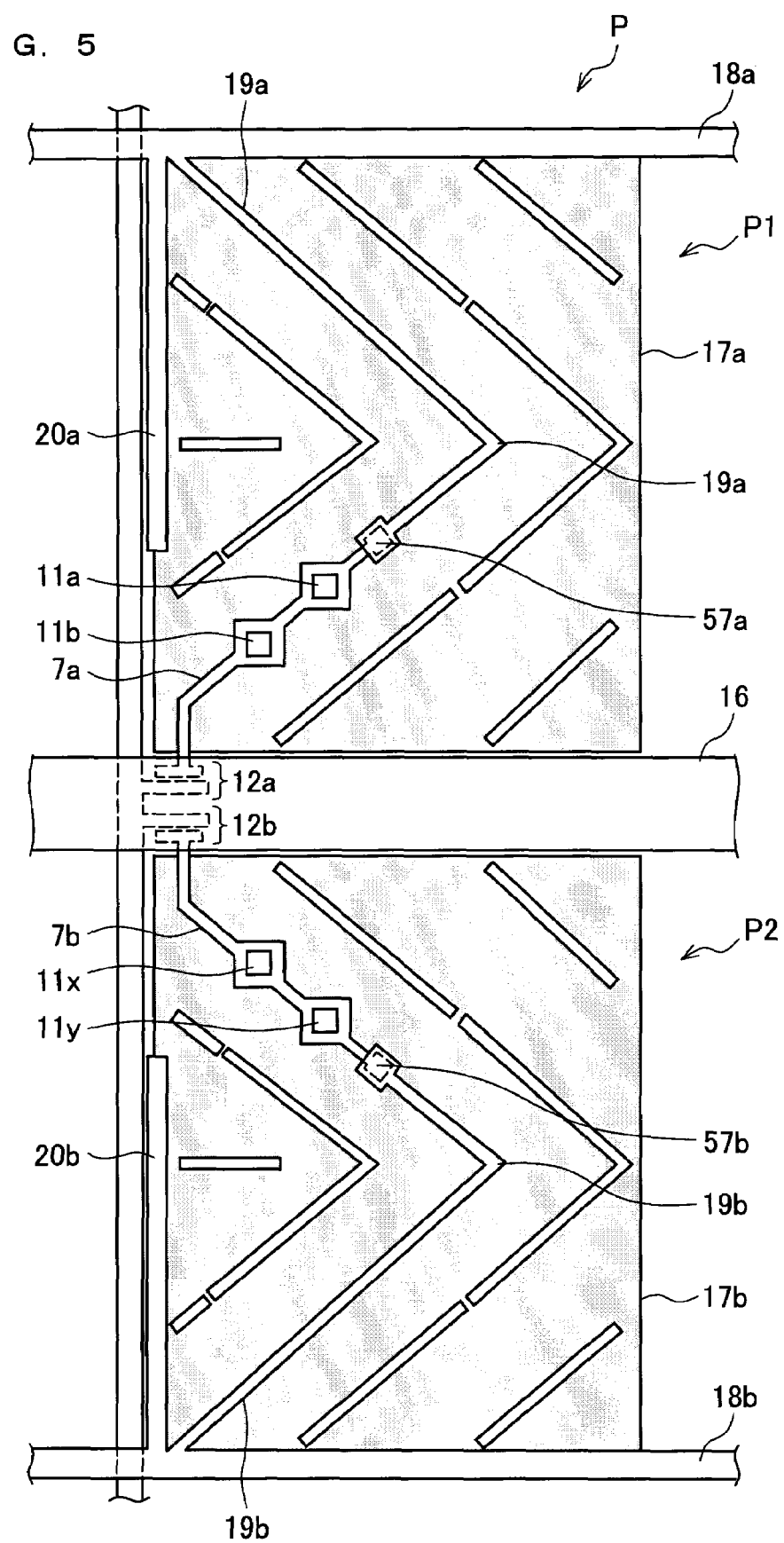
FIG. 5 is a plan view of an arrangement of the active matrix substrate.

In accordance with the present preferred embodiment, it is possible to build an active matrix substrate as indicated in FIG. 5. More specifically, two sub-pixels P1 and P2 are created on a pixel P. Created on the sub-pixel P1 are (i) a TFT 12a, (ii) a drain lead wiring 7a connected with the drain electrode of the TFT 12a, (iii) a pixel electrode 17a, and (iv) a storage capacitor wiring 18a. The pixel electrode 17a is connected with the drain lead wiring 7a via contact holes 11a and 11b, and an overlapping area 57a is created, in which a repair wiring 19a and the drain lead wiring 7a overlap each other with an insulating layer interposed therebetween. Also, created on the sub-pixel P2 are (i) a TFT 12b, (ii) a drain lead wiring 7b connected with the drain electrode of the TFT 12b, (iii) a pixel electrode 17b, and (iv) a storage capacitor wiring 18b. The pixel electrode 17b is connected with the drain lead wiring 7b via contact holes 11x and 11y, and an overlapping area 57b is created, in which a repair wiring 19b and the drain lead wiring 7b overlap each other with an insulating layer interposed therebetween. Additionally, a scanning signal line 16 works as a gate electrode of the TFTs 12a and 12b.

The storage capacitor wiring 18a is formed across from the scanning signal line 16 and overlaps an edge of the pixel electrode 17a so as to extend perpendicularly or substantially perpendicularly to the data signal line 15. The repair wiring 19a is stretched from the vicinity of the intersection point of the storage capacitor wiring 18a with the data signal line 15 so as to form a V-shape which is turned around 90 degrees on the pixel electrode 17a. An end of the repair wiring 19a forms the overlapping area 57a. Also, the storage capacitor wiring 18b is formed across from the scanning signal line 16 and overlaps an edge of the pixel electrode 17b so as to extend perpendicularly or substatially perpendicularly to the data signal line 15. The repair wiring 19b is stretched from the vicinity of the intersection point of the storage capacitor wiring 18b with the data signal line 15 so as to form a V-shape which is turned around 90 degrees on the pixel electrode 17b. An end of the repair wiring 19b forms the overlapping area 57b.

Such an arrangement as indicated in FIG. 5 is called the multi-pixel structure. By forming a pixel with two or more sub-pixels, even if a pixel defect occurs and is repaired, decrease in the normal pixel ratio can be reduced. According to this arrangement, although the size of a pixel in a 37-inch display device with 960×540 dots is 284 µm×854 µm, the size of a pixel, when formed with two sub-pixels, is one-half that size, which can in turn reduce decrease in the normal pixel ratio.

In applying this multi-pixel structure, it is preferable that the sub-pixels P1 and P2 should be driven so that luminance levels are different from each other. As a result, because a bright sub-pixel and a dark sub-pixel both exist on one pixel, the half tone can be displayed by the pulse-surface-area modulation, and white saturation, which occurs to a liquid crystal display screen when viewed at oblique angles, can be reduced.

In this multi-pixel arrangement, two or more storage capacitor wirings (18a and 18b), to which signal voltages of opposing phases are applied, are created on the pixel P. And the storage capacitor wirings (18a and 18b) respectively overlap pixel electrodes (17a and 17b) of different sub-pixels (P1 and P2) with insulating layers interposed therebetween. As a result, a bright sub-pixel and a dark sub-pixel can be formed. Additionally, the signal voltages of the opposing phases applied respectively to the storage capacitor wirings (18a and 18b) are Cs waveform voltages, which are used to operate the area coverage modulation on a pixel with two or more sub-pixels. There are two types of such voltages; one is a Cs waveform voltage (with a plus Cs polar character) that helps increase drain signal voltages (Vs) which are supplied by the source when the capacities are coupled after gate signals are turned off, and the other type is another Cs waveform voltage (with a minus Cs polar character) that helps decrease Vs under the same conditions. In such a multi-pixel structure (pulse-surface-area modulation), by coupling the capacities of the Cs waveform voltages, the Cs capacity and the liquid crystal capacity, effective voltages to the pixels are changed depending on each sub-pixel to form a bright sub-pixel and a dark pixel, which can achieve the multi-drive. As for the multi-pixel structure (pulse-surface-area modulation), for example, Japanese Unexamined Patent Application Publication No. 2004-62146 and others disclose the details.

Additionally, when using the multi-pixel structure, such structures are possible as a 1:1 pixel-segmented structure, in which the area of bright sub-pixels is equal to that of dark sub-pixels, or a 1:3 pixel-segmented structure, in which the area of bright sub-pixels is one-third that of dark sub-pixels. Among others, the 1:3 pixel-segmented structure is particularly effective in order to reduce white saturation (for better viewing angles), which occurs to a liquid crystal display screen when viewed at oblique angles.

The bright sub-pixel and the dark sub-pixel being P1 and P2, respectively, if a channel leak occurs to the TFT 12b of the dark sub-pixel P2, the defect may not easily be detected compared to the bright sub-pixel P1. Therefore, it is possible to form the overlapping area 57a, in which the repair wiring 19a and the drain lead wiring 57a overlap, on the bright sub-pixel P1 alone (that is, in FIG. 5, the overlapping area 57b is not formed on the sub-pixel P2) so that pixel defects can be repaired. As a result, the process of repairing pixel defects can be shortened, and decrease in the aperture ratio can be reduced.

Figure 6:
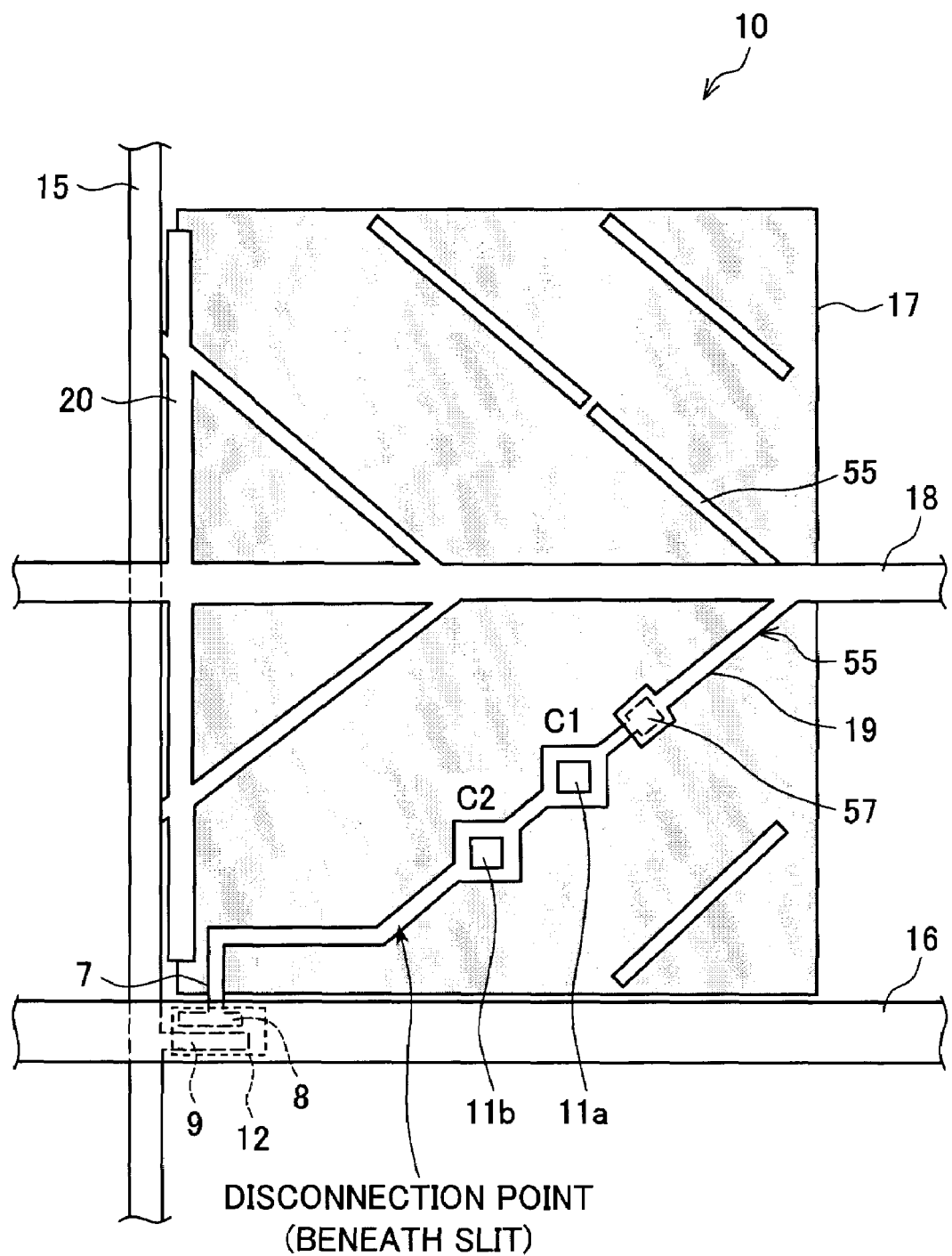
FIG. 6 is a plan view of an arrangement of the active matrix substrate.
Figure 14:
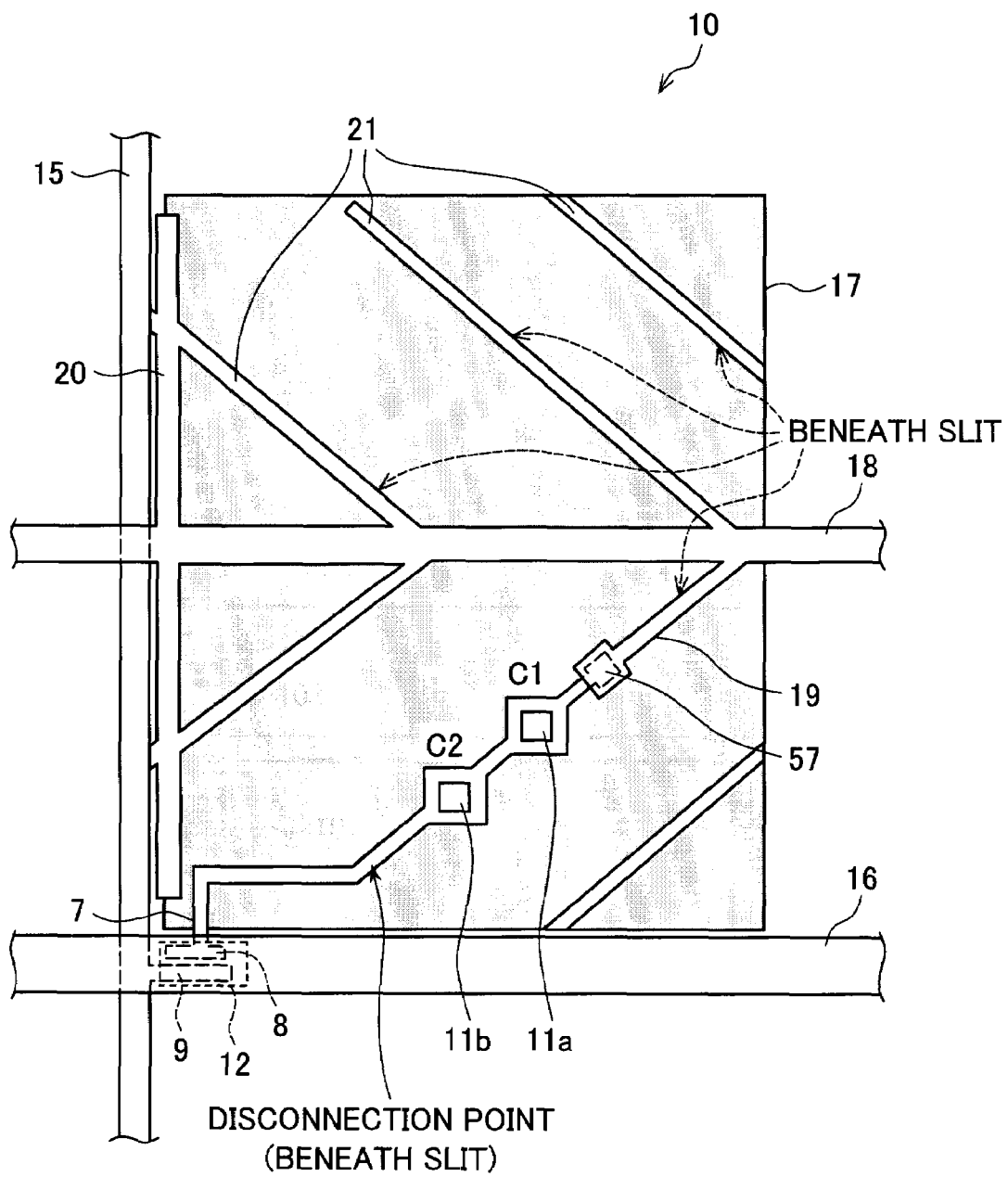
FIG. 14 is a plan view of an arrangement of the active matrix substrate.
Figure 15:
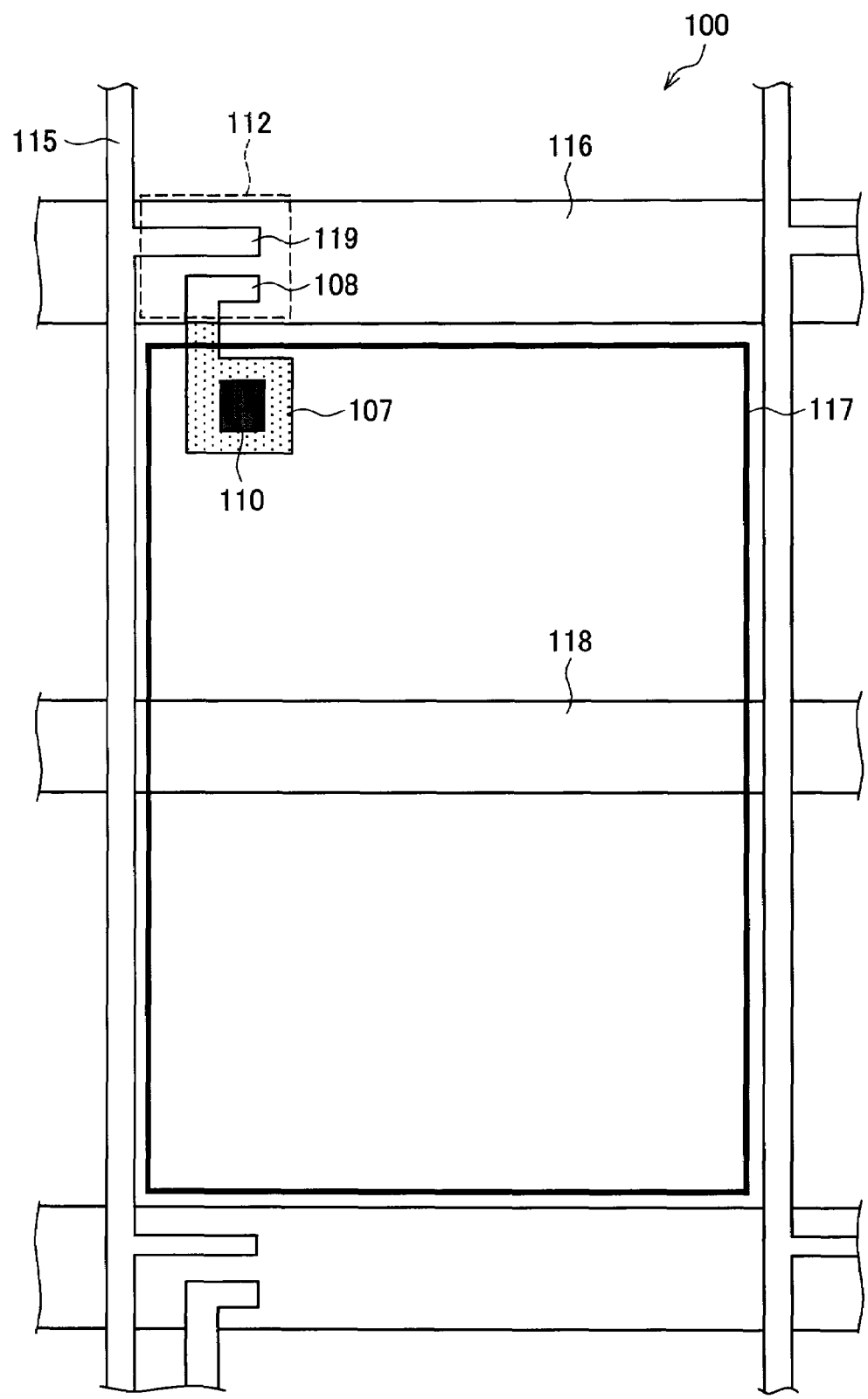
FIG. 15 is a plan view of a conventional arrangement of an active matrix substrate.

In accordance with the present preferred embodiment, the active matrix substrate may be arranged as in FIG. 6. More specifically, the repair wiring 19 is formed to overlap the slit 55 of the pixel electrode 17. By forming the repair wiring 19, whose potential is different from that of the pixel electrode 17, under the pixel electrode slit 55, the fringe field effect at the slit 55 is expressed more effectively, and the control of liquid crystal orientation is improved. Light leaks can also be prevented. Furthermore, by forming the repair wiring 19, which blocks light, beneath the slit 55, which does not contribute to the aperture ratio, decrease in the aperture ratio by the repair wiring 19 can be prevented. In this case, as FIG. 14 indicates, it is even more effective to create a stretched portion 21 of the storage capacitor 18 beneath the most possible portion (or preferably all) of the slit 55 of the pixel electrode 17.

Furthermore, as FIG. 6 indicates, it is preferable that the drain lead wiring 7 should be formed to overlap the slit 55 of the pixel electrode 17 (and that the portion overlapping the slit 55 should account for the drain lead wiring 7 as much a possible). As a result, by forming the drain lead wiring 7, which blocks light, beneath the slit for alignment control of liquid crystal molecules 55, which does not contribute to the aperture ratio, decrease in the aperture ratio by the drain lead wiring 7 can be prevented. Light leaks can also be prevented. And, if the transistor 12 malfunctions, the drain lead wiring 7 can be cut in a portion thereof which overlaps with the slit for alignment control of liquid crystal molecules 55 (that is, the portion without the pixel electrode 17 above), which makes the cutting process easier.

Figure 8:
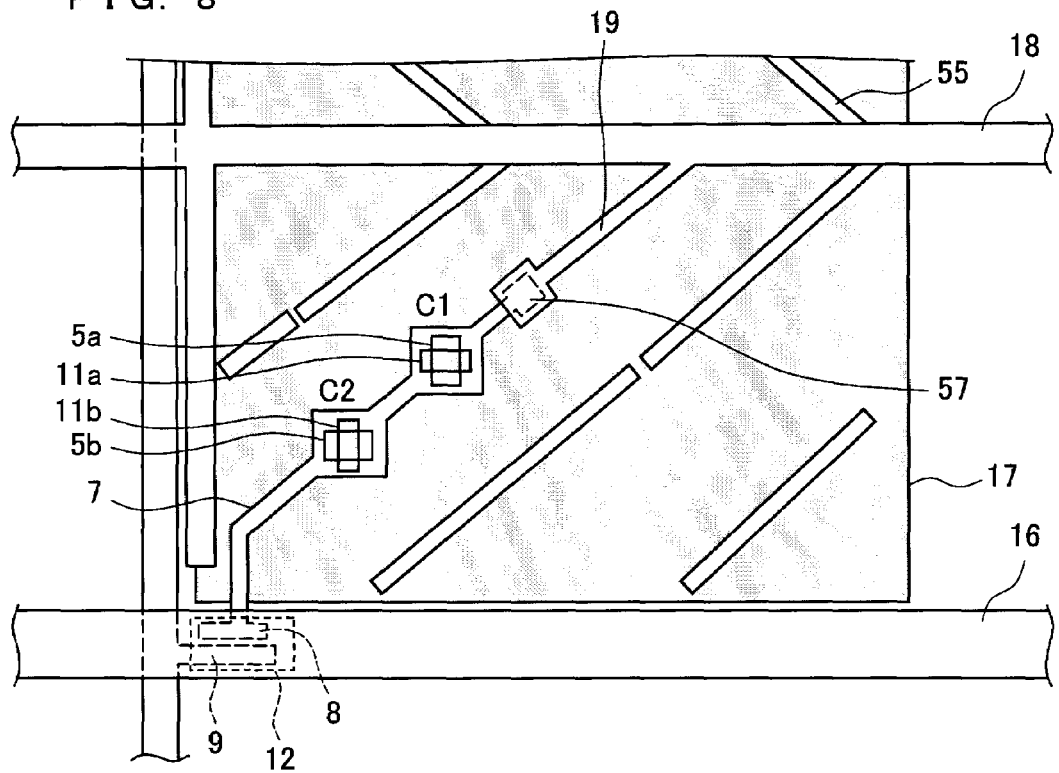
FIG. 8 is a plan view of an arrangement of the active matrix substrate.

In accordance with the present preferred embodiment, the active matrix substrate may be arranged as in FIG. 8. More specifically, in the contact area C1 (or the portion of the drain lead electrode 7 therein), a through bore section 5a (a non-electrode area) is formed preferably to have a rectangular or substantially rectangular shape whose longitudinal direction runs vertically in FIG. 8. Also, in an insulating layer formed between the drain lead wiring 7 and the pixel electrode 17 (not indicated in FIG. 8), a hole is formed preferably to have a rectangular or substantially rectangular shape whose longitudinal direction runs horizontally in FIG. 8. The hole crosses a central portion of the through bore section 5a at substantially right angle. As a result, the hole in the insulating layer provides an aperture, forming a contact hole 11a, and in this contact hole 11a, the drain lead wiring 7 and the pixel electrode 17 are connected. And in the contact area C2 (or the portion of the drain lead electrode 7 therein), a through bore section 5b (a non-electrode area) is formed preferably to have a rectangular or substantially rectangular shape whose longitudinal direction runs horizontally in FIG. 8. Also, in the insulating layer formed between the drain lead wiring 7 and the pixel electrode 17 (not indicated in FIG. 8), a hole is formed preferably to have a rectangular or substantially rectangular shape whose longitudinal direction runs vertically in FIG. 8. The hole crosses a central portion of the through bore section 5b substantially at a right angle. As a result, the hole in the insulating layer provides an aperture, forming a contact hole 11b, and in this contact hole 11b, the drain lead wiring 7 and the pixel electrode 17 are connected. By creating the through bore sections 5a and 5b in which sections no electrode is formed on the drain lead wiring 7, which blocks light, the light transmission (aperture ratio) can be improved. In addition, because the contact holes 11 are formed in a stretched shape so that the apertures thereof cross the through bore sections 5, the active matrix substrate can be more tolerant of misalignment during the manufacturing process (for example, photolithography), and change (decrease) in the contact area between the electrode area and the pixel electrode can be prevented or reduced significantly. This arrangement in FIG. 8 is particularly preferable when the contact area of the drain lead wiring 7 is not formed (or cannot be formed) beneath the slit 55 of the pixel electrode 17 or the projection (rib) for alignment control of liquid crystal molecules.

In accordance with the present preferred embodiment, the shape of the overlapping area 57 is not limited to a square as illustrated in FIG. 1. For example, it may be a circle, a triangle, a semicircle or a trapezoid. That is, it suffices as long as a portion of the repair wiring 19 is created to overlap the pattern of the drain lead wiring 7 with the gate insulating layer 23 interposed therebetween, and at least an area for laser irradiation is secured. Also, the location of the overlapping area 57 is not particularly limited. And the locations for forming the storage capacitor wiring 18, the repair wiring 19, and the stretched portion 20 of the storage capacitor wiring are also not limited to the arrangements described above.

A liquid crystal panel can be formed by (a) attaching the active matrix substrate obtained in the aforementioned preferred embodiment to a color filter substrate that is formed to include (i) color layers created in a matrix, which layers provide red, green or blue color to each pixel of the active matrix substrate respectively, and (ii) a black matrix that is light-blocking and is created between the color layers, and by (b) injecting and sealing liquid crystal (see FIG. 10). By connecting a driver (an LSI for liquid crystal drive) and the like with this liquid crystal panel, and by attaching polarizers and a backlight, a liquid crystal display device according to a preferred embodiment of the present invention is formed.

Figure 11:
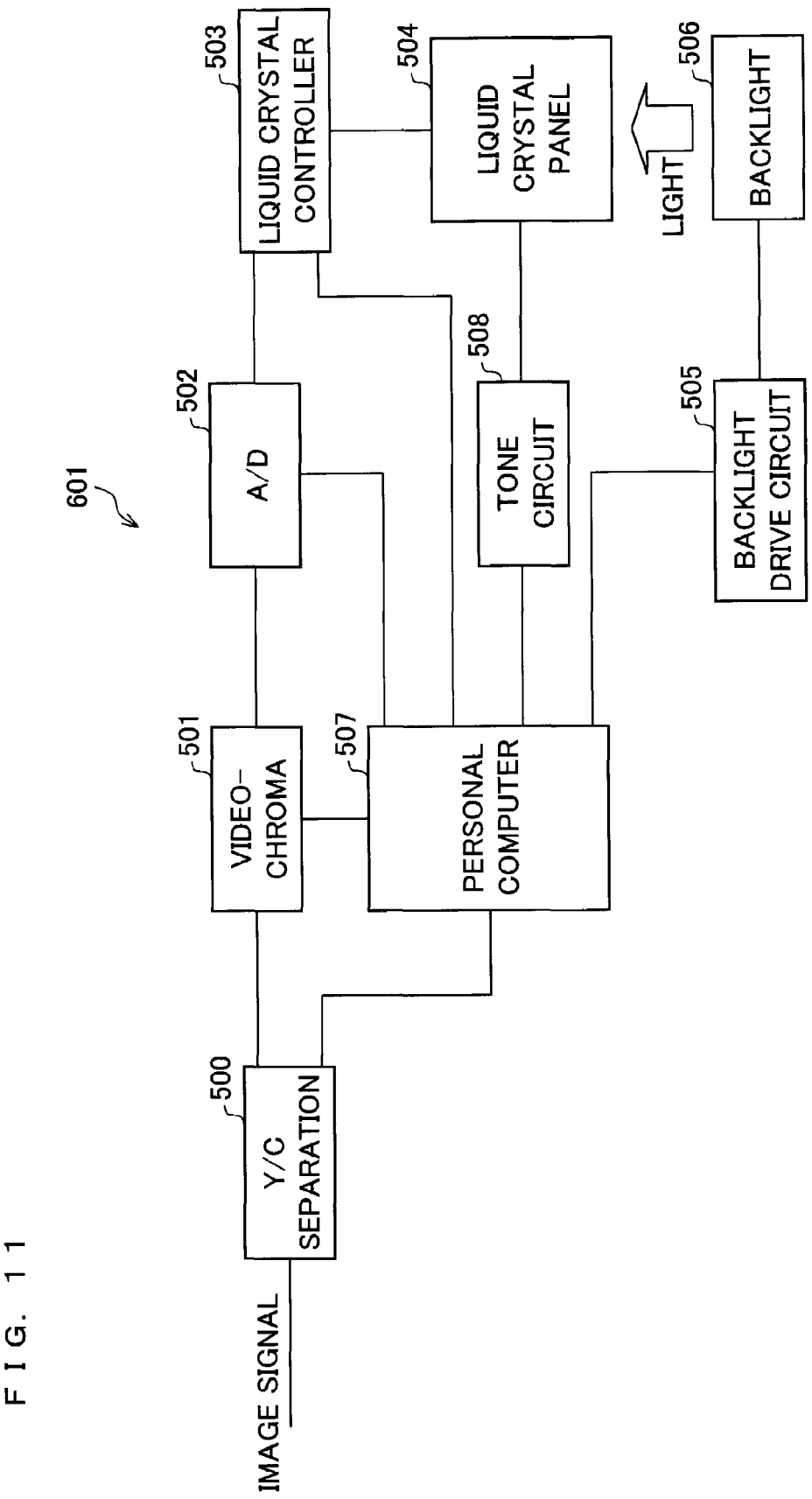
FIG. 11 is a block diagram of an arrangement of a liquid crystal display device according to a preferred embodiment of the present invention.
Figure 12:
FIG. 12 is a block diagram of an arrangement of a television receiver according to another preferred embodiment of the present invention.
Figure 13:
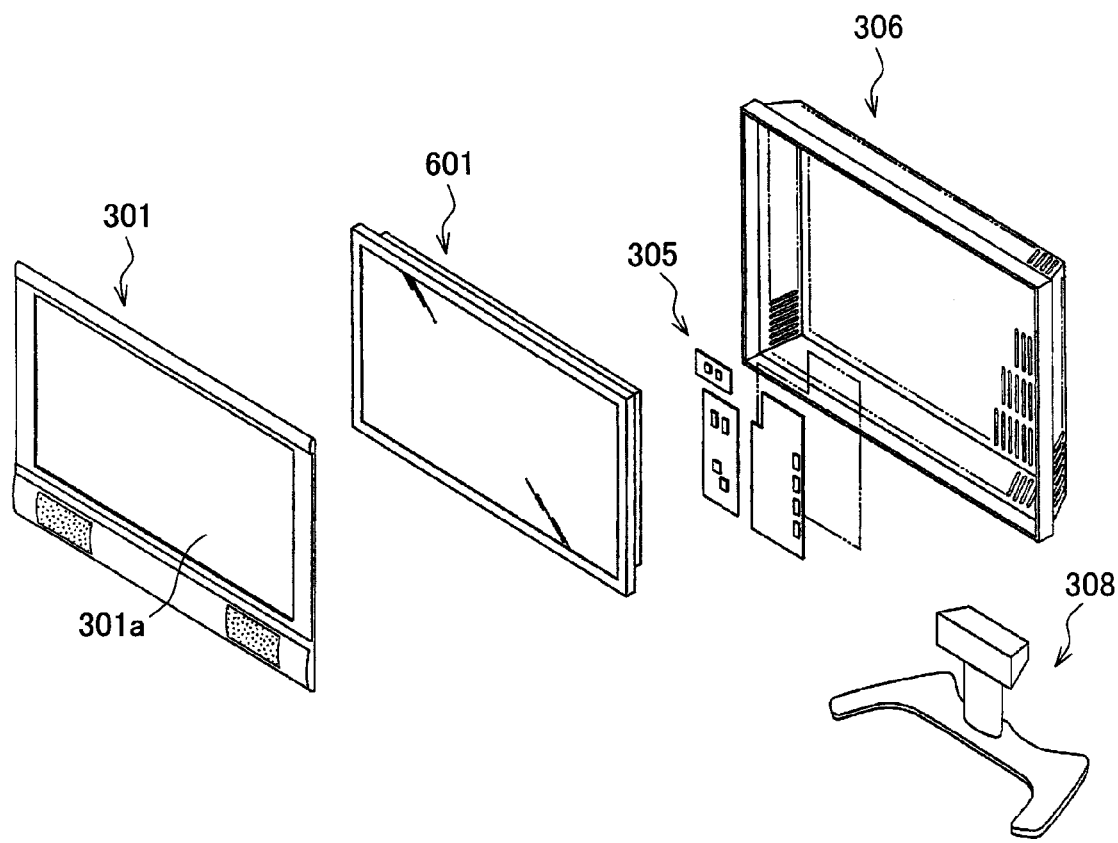
FIG. 13 is a perspective view of an arrangement of a television receiver according to a further preferred embodiment of the present invention.

Explained below with reference to FIGS. 11 to 13 is a television receiver to which this liquid crystal display device is applied.

FIG. 11 is a circuit block diagram of a liquid crystal display device 601 in a television receiver. As FIG. 11 indicates, the liquid crystal display device 601 preferably includes: a Y/C separation circuit 500; a video-chroma circuit 501; an A/D converter 502; a liquid crystal controller 503; a liquid crystal panel 504; a backlight drive circuit 505; a backlight 506; a microcomputer 507; and a tone circuit 508. In the liquid crystal display device 601 in the aforementioned arrangement, an input image signal of a television signal is first entered into the Y/C separation circuit 500, in which it is divided into a luminance signal and a color signal. The luminance signal and the color signal are converted into R, G and B, which are light's three primary colors, and these analog RGB signals are converted into digital RGB signals, which are then entered into the liquid crystal controller 503. On the liquid crystal panel 504, images are displayed as the RGB signals from the liquid crystal controller 503 are entered at set times, and tone voltages for each color component of R, G and B are provided from the tone circuit 508. The entire system, including these processes, is controlled by the microcomputer 507. Additionally, an image can be displayed based on various image signals such as those based on television broadcast, those taken by cameras, and those provided via Internet lines.

Furthermore, as FIG. 12 illustrate, this television receiver includes a tuner unit 600 and the liquid crystal display device 601. The tuner unit 600 receives television broadcast and outputs an image signal, and the liquid crystal display device 601 shows an image based on the image signal output from the tuner unit 600.

This television receiver can be arranged such that the liquid crystal display device 601 is covered by a first display chassis 301 and a second display chassis 306. On the first display chassis 301, an aperture 301a is formed in order to transmit an image displayed by the liquid crystal display device 601. Also, the second display chassis 306 covers the backside of the liquid crystal display device 601. An operation circuit 305 is created on the second display chassis 306 to operate the liquid crystal display device 601, and, to the lower portion of the liquid crystal display device 601, a support member 308 is attached.

As a display device for the above-described arrangement, the liquid crystal display device indicated in FIG. 11 may be applied, and other display devices such as an organic EL display device are also applicable.

Additionally, the present invention is not limited to liquid crystal display devices. For example, it is possible to build an organic EL display device with an active matrix substrate according to a preferred embodiment of the present invention in such a manner that a color filter substrate and the active matrix substrate according to a preferred embodiment of the present invention face each other; an organic EL layer is provided between those substrates to form an organic EL panel; and a driver or the like is connected with an external lead terminal of the panel. The present invention may also be applied to any display device including an active matrix substrate, apart from liquid crystal display devices or organic EL display devices.

An active matrix substrate according to various preferred embodiments of the present invention is preferably applicable, for example, to liquid crystal televisions.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. An active matrix substrate, comprising:
   a transistor including a plurality of conduction electrodes;
   a lead wiring extending from one of the conduction electrodes of the transistor;
   a pixel electrode connected with the lead wiring;
   a storage capacitor wiring; and
   an extended portion extending from the storage capacitor wiring; wherein
   an overlapping area is provided in which the extended portion and a portion of the lead wiring overlap each other with an insulating layer interposed therebetween, and
   the pixel electrode has a slit, and the overlapping area is provided under the slit.

2. The active matrix substrate according to claim 1, wherein the slit is arranged to perform alignment control of liquid crystal molecules.

3. The active matrix substrate according to claim 1, wherein the pixel electrode has a notch section having at least a portion that overlaps a portion of the lead wiring between the one of the conduction electrodes and a portion where the lead wiring is connected with the pixel electrode.

4. The active matrix substrate according to claim 3, wherein the notch section is arranged on an edge of the pixel electrode.

5. The active matrix substrate according to claim 1, wherein:
   another of the conduction electrodes of the transistor is connected with a data signal line;
   the storage capacitor wiring has another extended portion other than the extended portion; and
   said another extended portion extends alongside the data signal line and overlaps an edge of the pixel electrode.

6. The active matrix substrate according to claim 1, wherein an end of the extended portion and an end of the lead wiring overlap each other at the overlapping area.

7. A liquid crystal panel, comprising:
   an active matrix substrate according to claim 3; and
   a counter substrate having a black matrix, wherein
   at least a portion of the notch section overlaps the black matrix.

8. A liquid crystal panel, comprising an active matrix substrate according to claim 1.

9. A liquid crystal display device, comprising an active matrix substrate according to claim 1.

10. A television receiver comprising:
    a liquid crystal display device according to claim 9; and
    a tuner unit that is arranged to receive television broadcast.

* * * * *